United States Patent [19]

Tsutsumi

[11] Patent Number: 4,987,278
[45] Date of Patent: * Jan. 22, 1991

[54] PUSH-BUTTON SWITCH

[75] Inventor: Jyoji Tsutsumi, Iwaki, Japan

[73] Assignee: Alps Electric Co., Ltd., Tokyo, Japan

[*] Notice: The portion of the term of this patent subsequent to Apr. 3, 2007 has been disclaimed.

[21] Appl. No.: 311,922

[22] Filed: Feb. 16, 1989

[30] Foreign Application Priority Data

Apr. 27, 1988 [JP] Japan .................. 63-56947[U]

[51] Int. Cl.⁵ .......................................... H01H 13/06
[52] U.S. Cl. .................................. 200/294; 200/303; 200/406
[58] Field of Search ............... 200/244, 306, 293, 406

[56] References Cited

U.S. PATENT DOCUMENTS 4,331,851 5/1982 Johnson .............................. 200/517

Primary Examiner—Renee S. Luebke
Attorney, Agent, or Firm—Guy W. Shoup; David W. Heid

[57] ABSTRACT

A push-button switch wherein proper operation is always assured. The push-button switch includes an insulating case of an enclosure structure having a side wall from which a plurality of connecting terminals and a dummy terminal are exposed outside. The insulating case further has a first recess formed in a lower face thereof on the side of the dummy terminal which opposes to a printed circuit board to which the push-button switch is soldered, and a second recess formed in the first recess and located below the dummy terminal. A projected step portion is provided around the dummy terminal and has a side face having a sufficient height to prevent flux of cream solder from advancing to the location of the dummy terminal. Upon soldering, flux will be retained in the first and second recesses of the insulating case and between the projected portion and the side wall on which the stepped portion is provided and will not stick to any portion around the dummy terminal thereby to assure communication of air between the inside and the outside of the insulating case after soldering by way of a fine gap between the dummy terminal and the insulating case.

2 Claims, 3 Drawing Sheets

PUSH-BUTTON SWITCH

BACKGROUND OF THE INVENTION

1. Field of the Invention

This invention relates to a push-button switch for use with a television set, a video tape recorder, a cassette deck or a like apparatus, and more particularly to a push-button switch having a water-proof and dust-proof structure of the face mounted type wherein the inside of an insulating case is enclosed.

2. Description of the Prior Art

In recent years, as miniaturization of electronic appliances progresses, the density of parts mounted on a printed circuit board is progressively increased. This leads to use of a progressively increasing amount of push-button switches particularly of the face mounted type. A push-button switch of the face mounted type is mounted in such a manner that it is first placed on a printed circuit board having cream solder applied to predetermined locations thereof in advance and is then heated in a reflow furnace or the like to solder connecting terminals of the push-button switch to a wiring pattern on the printed circuit board.

An exemplary one of such push-button switches of the face mounted type is shown in FIGS. 7 and 8. Referring to FIGS. 7 and 8, the push-button switch shown includes a heat resisting insulating case 1 having an opening at the top thereof, and a central fixed contact 2 and a pair of opposite side fixed contacts 3 mounted on an inner face of a bottom wall of the insulating case 1. The fixed contacts 2 and 3 extend horizontally outwardly through a side wall of the insulating case 1 to terminate in a pair of connecting terminals 4 and 5, respectively. A dummy terminal 6 is connected to the opposite side fixed contacts 3 and extends horizontally outwardly through the side wall of the insulating case 1 between the connecting terminals 4 and 5. A dome-shaped spring plate 7 serving as a movable contact is placed on and extends between the opposite side fixed contacts 3 such that it is spaced by a little distance from the central fixed contact 2 when it is not operated.

A stem 8 formed from a metal material is mounted for up and down movement in the top opening of the insulating case 1. The stem 8 has a projection 9 provided on a lower face thereof and held in normal contact with the spring plate 7. The stem 8 is covered at an upper face thereof with a water-proof and dust-proof heat resisting film 10 adhered thereto using a bonding agent. A holding plate 12 is mounted on an upper face of the heat resisting film 10 and has an opening 11 formed at a central portion thereof. The holding plate 12 is formed, for example, from a stainless steel plate to which solder plating is applied. The holding plate 12 has a pair of retaining pawls 14 which are engaged with a pair of projections 13 in the form of ribs projected horizontally sidewardly from another pair of opposing side walls of the insulating case 1 to secure the holding plate 12 to the insulating case 1. The holding plate 12 thus defines an upper limit position of the stem 8. An operating portion 15 of the stem 8 is fitted in the opening 11 of the holding plate 12 and is covered with the heat resisting film 10. The holding plate 12 partially extends downwardly to terminate in a ground terminal 18.

In mounting the push-button switch having such a construction as described above, first, the connecting terminals 4 and 5 and the ground terminal 18 of the push-button switch are placed on a wiring pattern 17 of a printed circuit board 16 to which cream solder 19 is applied in advance. Then, the push-button switch and the printed circuit board 16 are heated to a temperature higher than 200° C. in a reflow furnace to melt the cream solder. Consequently, the connecting terminals 4 and 5 and the ground terminal 18 of the push-button switch are connected to the wiring pattern 17 of the printed circuit board 16 by the cream solder 19 as seen in FIG. 8.

If the operating portion 15 of the stem 8 of the push-button is depressed manually, the spring plate 7 is deformed downwardly by the projection 9 of the stem 8 until it is brought into contact with the central fixed contact 2 whereupon the fixed contacts 2 and 3 are electrically connected to each other by the spring plate 7 to turn the switch on. Then, if the depressing force to the operating portion 15 of the stem 8 is removed, the spring plate 7 is returned to its initial upward position by the resilient force of itself thereby to return the switch to its off condition.

In such a conventional push-button switch as described above, the connecting terminals 4 and 5 are soldered by heating at a temperature higher than 200° C. for about 2 to 4 minutes within a reflow furnace as described above. Upon such soldering, air within the insulating case 1 is expanded due to such a high temperature so that the air pressure in the insulating case 1 is raised.

The air of such a high pressure will flow out through a gap between the upper face of the insulating case 1 and the bonding agent on the lower face of the heat resisting film 10 which is reduced in adhesive strength due to the high temperature and also through fine gaps between the insulating case 1 and the connecting terminals 4 and 5. Consequently, a large amount of flux contained in the cream solder 19 will be introduced into the fine gaps around the connecting terminals after the pressure is equalized.

After the push-button switch is taken out of the reflow furnace, the air within the insulating case 1 is contracted and the air pressure is decreased as the temperature lowers. However, because the bonding agent on the lower face of the heat resisting film 10 restores its initial high adhesive strength as the temperature lowers, external air will not be admitted into the insulating case 1 through the bonding agent. At the same time, since flux is filled in the fine gaps 20 around the connecting terminals 4 and 5, external air will not be admitted in through the fine gaps 20 either. Consequently, the air pressure within the insulating case 1 thereafter remains at a very low level. When the air pressure is decreased, the heat resisting film 10 is deformed downwardly to depress the stem 8 until the spring plate 7 is contacted with and stopped by the fixed contact 2. Thus, in the assembled condition of the push-button switch to the printed circuit board 16, the fixed contacts 2 and 3 are held in an electrically connected condition by the spring plate 7. Accordingly, the push-button switch will not operate properly.

In order to prevent this, the dummy terminal 6 is provided to permit external air to flow into the insulating case 1 through a gap 21 between the insulating case 1 and the dummy terminal 6 connected to the opposite side fixed contacts 3 for a long period of time of about 30 minutes to one hour. Even so, since the flux for facilitating application of the cream solder 19 is about 15 percent or so of the cream solder, when melted, the flux may even reach the bottom wall and the side walls of the insulating case 1 and may sometimes stick to portions around the dummy terminal 6. Consequently, air is not communicated into the inside of the insulating case 1 after all, which also gives rise to a problem that the push-button switch will not operate properly.

SUMMARY OF THE INVENTION

It is an object of the present invention to provide a push-button switch wherein proper operation is always assured.

In order to attain the object, according to one aspect of the present invention, there is provided a push-button switch wherein a pair of metal members embedded in an insulating case having a heat resisting property are partially exposed to the enclosed inside of said insulating case to form a pair of fixed contacts while other portions of said metal members are exposed to the outside of said insulating case to form a plurality of connecting terminals adapted to be soldered to a wiring pattern of a printed circuit board to mount said push-button switch on said printed circuit board, and a dummy terminal is provided which is connected to said fixed contact and extends outwardly through a side wall of said insulating case, wherein a first recess is formed in a lower face of said insulating case on the side of said dummy terminal which opposes said printed circuit board while a second recess is formed in said first recess and located below said dummy terminal, and a stepped portion having a step with respect to a face of said side wall of said insulating case is provided near said dummy terminal on said face of said side wall of said insulating plate.

With the push-button switch, flux will be retained in the first and second recesses of the insulating case and between the stepped portion and the side wall on which the stepped portion is provided and will not stick to any portion around the dummy terminal. Consequently, communication of air between the inside and the outside of the insulating case is assured even after soldering of the push-button switch to the printed circuit board by way of a fine gap which is formed between the insulating case and a portion of the dummy terminal embedded in the insulating case. Accordingly, improper operation of the push-button switch arising from a difference in air pressure between the inside and the outside of the insulating case can be prevented with certainty.

According to another aspect of the present invention, there is provided a push-button switch wherein a pair of metal members embedded in an insulating case having a heat resisting property are partially exposed to the enclosed inside of said insulating case to form a pair of fixed contacts while other portions of said metal members are exposed to the outside of said insulating case to form a plurality of connecting terminals adapted to be soldered to a wiring pattern of a printed circuit board to mount said push-button switch on said printed circuit board, and a dummy terminal is provided which is connected to said fixed contact and extends outwardly through a side wall of said insulating case, wherein a projected portion is provided around said dummy terminal such that at least an end portion of said dummy terminal may be exposed outside, and a side face of said projected portion has a sufficient height to prevent flux from advancing to the location of said dummy terminal.

With the push-button switch, flux will be retained between the projected portion and the side wall of the insulating case on which the projected portion is provided and will not stick to an exposed face of the dummy terminal at all. Consequently, communication of air between the inside and the outside of the insulating case is assured, and accordingly, improper operation of the push-button switch arising from a difference in air pressure between the inside and the outside of the insulating case can be prevented with certainty.

The above and other objects, features and advantages of the present invention will become apparent from the following description and the appended claims, taken in conjunction with the accompanying drawings.

DETAILED DESCRIPTION OF THE PREFERRED EMBODIMENTS

Figure 1:
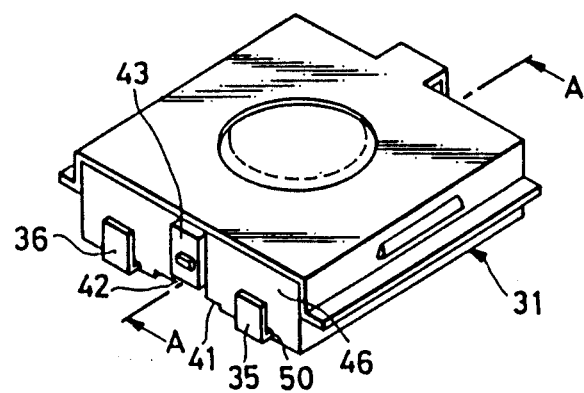
FIG. 1 is a perspective view of a push-button switch showing a preferred embodiment of the present invention.
Figure 2:
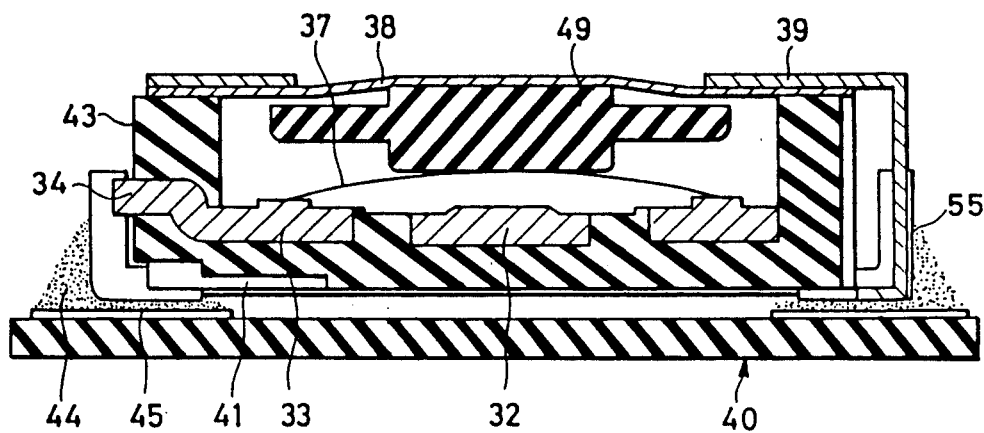
FIG. 2 is a sectional view taken along line A—A of FIG. 1 showing the push-button switch mounted on a printed circuit board.
Figure 7:
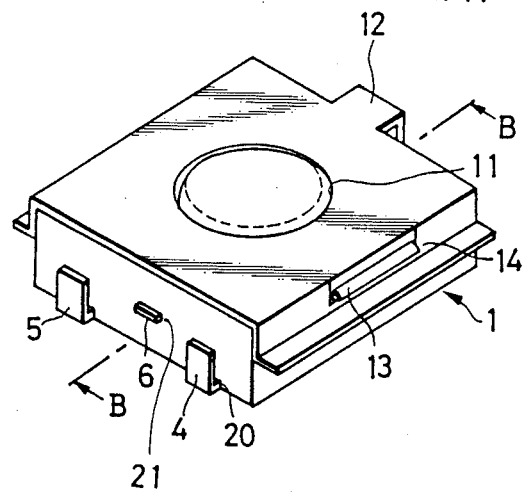
FIG. 7 is a perspective view showing a conventional push-button switch.
Figure 8:
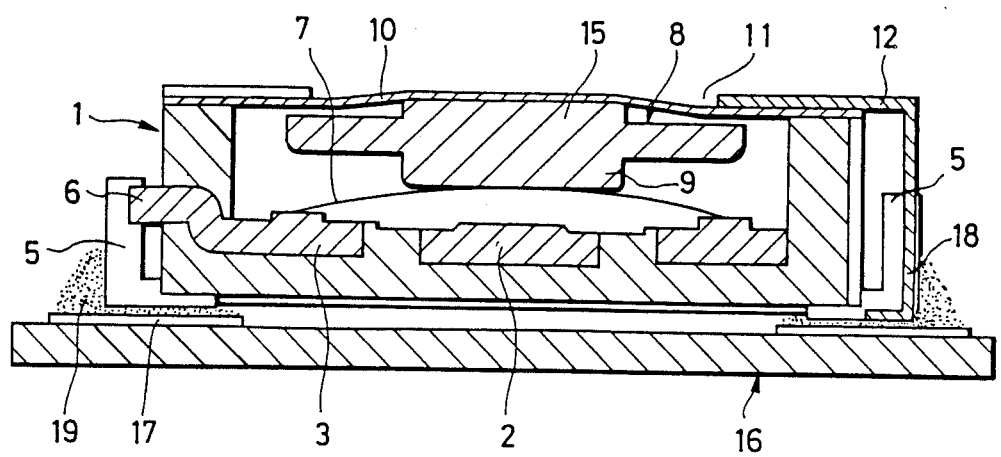
FIG. 8 is a sectional view taken along line B—B of FIG. 7 showing the conventional push-button switch mounted on a printed circuit board.

Referring first to FIGS. 1 and 2, there is shown a push-button switch according to a first preferred embodiment of the present invention. The push-button switch shown includes, similarly as in the conventional push-button switch described hereinabove with reference to FIGS. 7 and 8, an insulating case 31, a central fixed contact 32 and a pair of opposite side fixed contacts 33 embedded in a bottom wall of the insulating case 31 by insert molding, a dummy terminal 34 extending horizontally outwardly through a side wall 46 of the insulating case 31, a plurality of connecting terminals 35 and 36 extending from the central fixed contact 32 and the opposite side fixed contacts 33, respectively, through the side wall 46 of the insulating case 31, a spring plate 37 disposed on the opposite side fixed contacts 33 and serving as a movable contact, a stem 49 placed on the spring plate 37, a heat resisting film 38 adhered to an upper face of the insulating case 31 using a bonding agent, and a holding plate 39 having a ground terminal 55 and mounted on the insulating case 31 such that it may cover over an outer peripheral portion of the heat resisting film 38. The push-button switch, however, is different in the following points from the conventional push-button switch.

Figure 3:
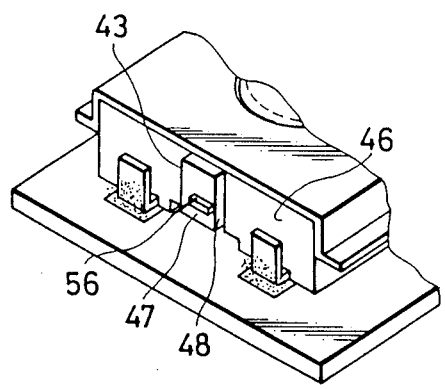
FIG. 3 is a partial perspective view of the push-button switch mounted on the printed circuit board of FIG. 2.
Figure 5:
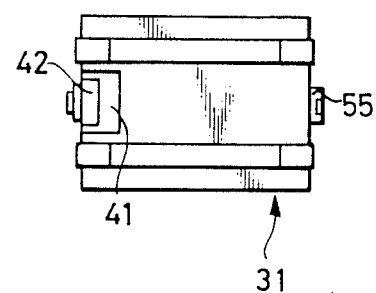
FIG. 5 is a bottom plan view of the push-button switch of FIG. 1.
Figure 4:
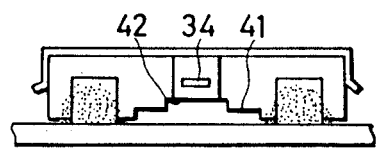
FIG. 4 is a front elevational view of the push-button switch shown in FIG. 3.

In particular, referring also to FIGS. 3 to 5, the insulating case 31 has a first recess 41 in the form of a shallow groove formed in the bottom wall or side wall 46 thereof below the dummy terminal 34, a second recess 42 formed in and adjacent the first recess 41, and a projected step portion 43 formed on the side wall 46 thereof around the dummy terminal 34 and projected outwardly to form a step with respect to the side wall 46.

The connecting terminals 35 and 36 of the push-button switch having such a construction as described above are placed on a wiring pattern 45 of a printed circuit board 40 to which cream solder 44 is applied in advance, and the push-button switch and the printed circuit board 40 are inserted into a reflow furnace in which they are subsequently heated for two to four minutes at a temperature of 200° C. or so as in the case of the conventional push-button switch described hereinabove. Consequently, the cream solder 44 is melted to effect soldering of the push-button switch to the printed circuit board 40.

In this instance, since the insulating case 31 is an enclosed structure, air within the insulating case 31 expands so that the pressure thereof is increased. Consequently, the air within the insulating case 31 flows out through a gap between an upper face of the insulating case 31 and the bonding agent applied to the lower face of the heat resisting film 38 because the adhesive strength of the bonding agent becomes lower as the temperature rises. The air within the insulating case 31 also flows out a little through a fine gap 50 between the insulating case 31 and each of the connecting terminals 35 and 36. Then, if the printed circuit board 40 and the push-button switch, after being soldered, are taken out of the reflow furnace, no air is admitted into the insulating case 31 through the gaps 50 around the connecting terminals 35 and 36 because flux contained in the cream solder 44 has been introduced into the gaps 50. Further, since an initial adhesive strength of the bonding agent is restored as the temperature returns to a normal temperature, no external air is admitted in through the gap between the upper face of the insulating case 31 and the bonding agent.

With the present push-button switch, however, since the first recess 41 and the second recess 42 are provided in the bottom wall or side wall 46 of the insulating plate 31 below the dummy terminal 34, even if flux enters a gap between the lower face of the insulating plate 31 and the printed circuit board 40, it will be held in the first and second recesses 41 and 42 and will not ride on the projected step portion 43 on the side wall 46. Consequently, no flux will stick to the dummy terminal 34.

On the other hand, if flux contained in the cream solder 44 flows to an outer face of the side wall 46 of the insulating case 31 on which the dummy terminal 34 is provided, it will stick to a corner or intersecting portion between the outer face of the side wall 46 and a side face 48 of the projected step portion 43 formed between an outer face 47 of the projected portion 43 and the outer face of the side wall 46 due to a horizontal dimension of the side face 48 of the projected stepped portion 43 which may be 0.1 mm or so. Accordingly, the flux will not be introduced by way of the side face 48 of the projected portion 43 to the surface 47 of the projected step portion 43 at which the dummy terminal 34 is exposed outside.

Thus, in the reflow furnace, air within the insulating case 31 flows out so that the spring plate 37 is displaced to a little deformed or depressed position by way of the stem 49. However, since no flux sticks to any portion around the dummy terminal 34, air is admitted into the insulating case 31 for a long period of time of about 30 to 60 minutes or so through a fine gap 56 between the dummy terminal 34 and the projected step portion 43. However, since the gap 56 is very fine, no water nor dust will be admitted in therethrough while air can be admitted in therethrough.

Figure 6:
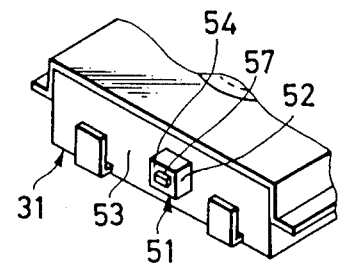
FIG. 6 is a perspective view of a push-button switch showing another preferred embodiment of the present invention.

Referring now to FIG. 6, there is shown a push-button switch according to a second preferred embodiment of the present invention. The push-button switch shown has a generally similar construction to the push-button switch of the preceding embodiment described above but is different from the latter in that an insulating case 31 has no recess formed in a side wall thereof below a dummy terminal 34 and the dummy terminal 34 is surrounded by a projected stepped portion 51. The projected portion 51 has a side face 52 having a horizontal dimension of 0.3 mm or so. Accordingly, even if flux sticks to an outer face of a side wall 53 of the insulating case 31 on which the dummy terminal 34 is provided, it will not be introduced to an outer face 54 of the projected step portion 51 by way of the side face 52 of the projected step portion 51. Consequently, air is admitted into the insulating case 31 through a fine gap 57 between the dummy terminal 34 and the projected portion 51 as in the case of the push-button switch of the preceding embodiment.

Having now fully described the invention, it will be apparent to one of ordinary skill in the art that many changes and modifications can be made thereto without departing from the spirit and scope of the invention as set forth herein.

What is claimed is:

1. In a push-button switch wherein a pair of metal members embedded in an insulating case having a heat resisting property, said insulating case having side walls defining an interior of said case, are partially exposed to the inside of said insulating case to form a pair of fixed contacts while other portions of said metal members are exposed to the outside of said insulating case to form a plurality of connecting terminals adapted to be soldered to a wiring pattern of a printed circuit board to mount said push-button switch on said printed circuit board, and a dummy terminal is provided which is connected to one of said pair of fixed contacts and extends outwardly through a side wall of said insulating case, the improvement wherein a first recess is formed in a lower face of said insulating case beneath said dummy terminal opposite said printed circuit board while a second recess is formed in said first recess and located below said dummy terminal, and a stepped portion having a step with respect to a face of said side wall of said insulating case is provided near said dummy terminal on said face of said side wall of said insulating case.

2. In a push-button switch wherein a pair of metal members embedded in an insulating case having a heat resisting property, said insulating case having side walls defining an interior of said case, are partially exposed to the inside of said insulating case to form a pair of fixed contacts while other portions of said metal members are exposed to the outside of said insulating case to form a plurality of connecting terminals adapted to be soldered to a wiring pattern of a printed circuit board to mount said push-button switch on said printed circuit board, and a dummy terminal is provided which is connected to one of said pair of fixed contacts and extends outwardly through a side wall of said insulating case, the improvement wherein a projected portion is provided around said dummy terminal such that at least an end portion of said dummy terminal may be exposed outside, and a side face of said projected portion has a sufficient height to prevent flux from advancing to said dummy terminal.

* * * * *